US012763745B2

(12) United States Patent
Iguchi et al.

(10) Patent No.: US 12,763,745 B2
(45) Date of Patent: Oct. 13, 2026

(54) EQUIVALENT CIRCUIT

(71) Applicant: TDK CORPORATION, Tokyo (JP)

(72) Inventors: Toshihiro Iguchi, Tokyo (JP); Masaki Hara, Tokyo (JP); Ryota Namiki, Tokyo (JP); Ayako Sato, Tokyo (JP); Kenya Tamaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 153 days.

(21) Appl. No.: 18/756,961

(22) Filed: Jun. 27, 2024

(65) Prior Publication Data

US 2025/0096765 A1 Mar. 20, 2025

(30) Foreign Application Priority Data

Sep. 19, 2023 (JP) ................................ 2023-151553

(51) Int. Cl.
*H03H 7/00* (2006.01)

(52) U.S. Cl.
CPC .................................... *H03H 7/00* (2013.01)

(58) Field of Classification Search
CPC ........................................................ H03H 7/00
See application file for complete search history.

(56) References Cited

U.S. PATENT DOCUMENTS 8,527,256 B2 * 9/2013 Wu ........................ G06F 30/367 361/306.3
2012/0185223 A1 7/2012 Wu
2018/0122566 A1 * 5/2018 Koch .................... G06F 30/367

FOREIGN PATENT DOCUMENTS

JP 2012-150579 A 8/2012
JP 5773101 B2 * 9/2015 ........... G06F 30/367
JP 2015170004 A * 9/2015

* cited by examiner

*Primary Examiner* — Andrea Lindgren Baltzell
*Assistant Examiner* — Kimberly E Glenn
(74) *Attorney, Agent, or Firm* — Oliff PLC

(57) ABSTRACT

An equivalent circuit includes a first capacitor having a first capacitance, a circuit part configured to include an inductor component, a capacitor component, and a resistor connected in series with one another, the circuit part being connected in parallel with the first capacitor, and a second capacitor provided between the first capacitor and the circuit part and having a second capacitance. The first capacitance of the first capacitor changes in accordance with a voltage value of a direct current voltage applied to the first capacitor. The second capacitor has the positive second capacitance that changes in accordance with the voltage value of the direct current voltage applied to the first capacitor and that is N times (N>0) the first capacitance of the first capacitor.

4 Claims, 4 Drawing Sheets

EQUIVALENT CIRCUIT

TECHNICAL FIELD

The present disclosure relates to an equivalent circuit for simulation of a multilayer capacitor.

BACKGROUND

Japanese Unexamined Patent Publication No. 2012-150579) discloses a circuit simulation model for a capacitor to which a DC bias is applied, the circuit simulation model including a non-linear voltage control voltage source configured to obtain, through actual measurement, a change characteristic of a circuit element included in a basic equivalent circuit of a predetermined capacitor due to the DC bias and replace the circuit element by defining the obtained change characteristic with a polynomial, a filter configured to extract a DC bias component from a voltage applied to the capacitor and supply the DC bias component to the non-linear voltage control voltage source, an arithmetic circuit configured to calculate a circuit equation regarding a voltage and a current created on the basis of the basic equivalent circuit using each output voltage of the non-linear voltage control voltage source, and a linear voltage control voltage source that couples the voltage applied to the capacitor to the arithmetic circuit.

SUMMARY

When a voltage value of an applied direct current voltage (DC bias) changes in a multilayer capacitor of an actual product (hereinafter simply referred to as a "multilayer capacitor"), a value of impedance (other than peaks) changes in a graph of a relationship between frequency and impedance. More specifically, as the voltage value of the direct current voltage becomes large in the multilayer capacitor, an absolute value of impedance becomes large.

In addition, when a direct current voltage is applied to the multilayer capacitor, peaks appear in impedance in the graph of the relationship between frequency and impedance. The peaks include a peak due to resonance (downward peak) and a peak due to antiresonance (upward peak). When a direct current voltage is applied to the multilayer capacitor, a plurality of peaks appears. When the voltage value of the direct current voltage changes in the multilayer capacitor, frequencies (a resonance frequency and an antiresonance frequency) at which peaks appear in impedance change. More specifically, when the voltage value of the direct current voltage becomes large in the multilayer capacitor, the frequencies at which the peaks appear in impedance are offset to a high-frequency side. When a voltage value of a direct current voltage changes in a conventional equivalent circuit, it is difficult to obtain a characteristic of change in frequencies at which peaks of impedance appear.

An object of an aspect of the present disclosure is to provide an equivalent circuit capable of obtaining a characteristic approximate to a characteristic of a multilayer capacitor of an actual product.

(1) An equivalent circuit according to an aspect of the present disclosure includes a first capacitor having a first capacitance, a circuit part configured to include an inductor component, a capacitor component, and a resistor connected in series with one another, the circuit part being connected in parallel with the first capacitor, and a second capacitor provided between the first capacitor and the circuit part and having a second capacitance. The first capacitance of the first capacitor changes in accordance with a voltage value of a direct current voltage applied to the first capacitor. The second capacitor has the positive second capacitance that changes in accordance with the voltage value of the direct current voltage applied to the first capacitor and that is N times (N>0) the first capacitance of the first capacitor.

In the equivalent circuit according to the aspect of the present disclosure, the first capacitance of the first capacitor changes in accordance with the voltage value of the direct current voltage applied to the first capacitor. As a result, in the equivalent circuit, a characteristic can be obtained in which a value of impedance (other than peaks) changes in accordance with changes in the voltage value of the applied direct current voltage. In addition, in the equivalent circuit, the circuit part is achieved by connecting an inductor component, a capacitor component, and a resistor component in series with one another. As a result, in the equivalent circuit, a characteristic in which peaks (resonance and antiresonance) appear in impedance can be obtained. The equivalent circuit includes the second capacitor. The second capacitor has the positive second capacitance that changes in accordance with the voltage value of the direct current voltage applied to the first capacitor and that is N (N>0) times the first capacitance of the first capacitor. As a result, in the equivalent circuit, a characteristic can be obtained in which frequencies (a resonance frequency and an antiresonance frequency) at which the peaks appear in impedance change when the voltage value of the direct current voltage changes. In the equivalent circuit, therefore, a characteristic approximate to a characteristic of a multilayer capacitor of an actual product can be obtained.

(2) The equivalent circuit according to (1) may further include a controller provided between the second capacitor and the circuit part and configured to control a current flowing through the circuit part on a basis of the voltage value of the direct current voltage. With this configuration, when the voltage value of the direct current voltage is small, the current flowing through the circuit part becomes small (the current does not flow through the circuit part), and when the voltage value of the direct current voltage is large, the current flowing through the circuit part becomes large. When the current flowing through the circuit part becomes small, no peak appears in impedance. As a result, a characteristic can be obtained in which no peak appears in impedance when the direct current voltage is 0 V.

(3) In the equivalent circuit according to (2), the controller may be a transformer. With this configuration, the current flowing through the circuit part can be controlled on the basis of the voltage value of the direct current voltage.

(4) In the equivalent circuit according to any one of (1) to (3), the second capacitance of the second capacitor may be 0.5 times or more and 1.0 times or less the first capacitance of the first capacitor. With this configuration, a characteristic can be obtained in which the frequencies (the resonance frequency and the antiresonance frequency) at which the peaks appear in impedance change when the voltage value of the direct current voltage changes.

According to the aspect of the present disclosure, a characteristic approximate to a characteristic of a multilayer capacitor of an actual product can be obtained.

DETAILED DESCRIPTION

Preferred embodiments of the present disclosure will be described in detail hereinafter with reference to the accompanying drawings. Note that the same or equivalent elements in the description of the drawings are given the same reference signs, and redundant description thereof is omitted.

First Embodiment

Figure 1:
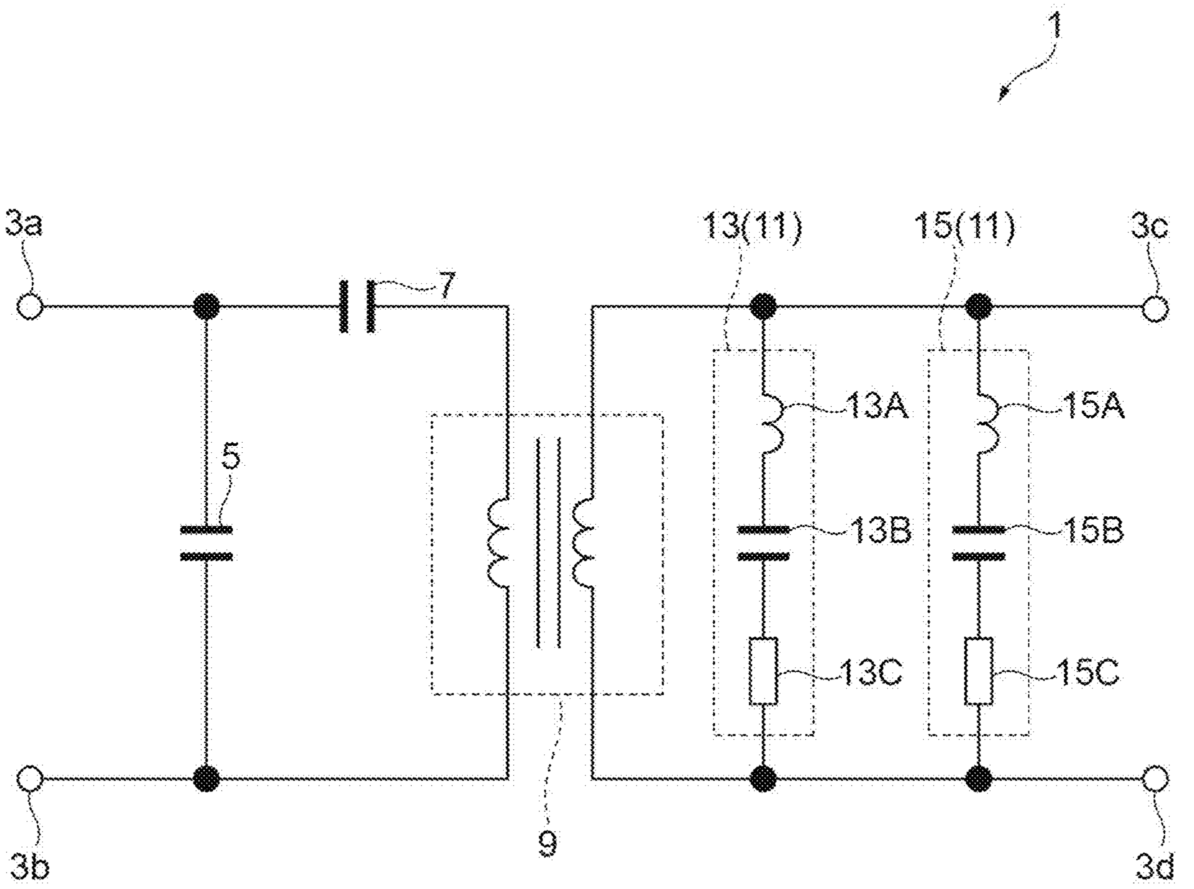
FIG. 1 is a diagram illustrating an equivalent circuit according to a first embodiment.

FIG. 1 is a diagram illustrating an equivalent circuit according to a first embodiment. An equivalent circuit 1 illustrated in FIG. 1 is, for example, a circuit used for simulation of circuit design and analysis where electronic components are used, and is used in a circuit design (analysis) program executed by a computer.

As illustrated in FIG. 1, the equivalent circuit 1 includes a first terminal 3*a*, a second terminal 3*b*, a third terminal 3*c*, a fourth terminal 3*d*, a first capacitor 5, a second capacitor 7, a transformer (controller) 9, and a circuit part 11.

The first terminal 3*a*, the second terminal 3*b*, the third terminal 3*c*, and the fourth terminal 3*d* can be connected to other circuits or the like. The first terminal 3*a* and the second terminal 3*b* can be input terminals. The third terminal 3*c* and the fourth terminal 3*d* can be output terminals.

The first capacitor 5 is connected between the first terminal 3*a* and the second terminal 3*b*. The first capacitor 5 has a first capacitance C1. The first capacitance C1 is a so-called damping capacitance. The first capacitance C1 changes in accordance with a voltage value of a direct current voltage applied to the first capacitor 5.

The second capacitor 7 is provided between the first capacitor 5 and the transformer 9. The second capacitor 7 has a second capacitance C2. The second capacitance C2 is a positive capacitance. The second capacitance C2 changes in accordance with the voltage value of the direct current voltage applied to the first capacitor 5. The second capacitance C2 is N times as large as the first capacitance C1 ($C2=N\times C1$). N is greater than 0 ($N>0$). The second capacitance C2 is 0.5 times or more and 1.0 times or less the first capacitance C1 ($0.5C\leq N\leq 1.0$). Preferably, the second capacitance C2 is 0.7 times or more and 0.9 times or less the first capacitance C1 ($0.7\leq N\leq 0.9$).

The transformer 9 is provided between the second capacitor 7 and the circuit part 11. The transformer 9 controls a current flowing through the circuit part 11. The transformer 9 controls the current flowing through the circuit part 11 in accordance with the voltage value of the direct current voltage applied to the equivalent circuit 1. More specifically, the transformer 9 increases the current flowing through the circuit part 11 when the voltage value of the direct current voltage becomes large, and reduces the current flowing through the circuit part 11 when the voltage value of the direct current voltage becomes small.

In the present embodiment, the circuit part 11 includes a first circuit 13 and a second circuit 15. The number of circuits in the circuit part 11 is set in accordance with the number of peaks appearing in an impedance graph. When two peaks appear in the impedance graph, for example, two circuits are provided.

The first circuit 13 is connected in parallel with the first capacitor 5. The first circuit 13 is connected in parallel with the first capacitor 5 via the transformer 9. The first circuit 13 includes an inductor (inductor component) 13A, a capacitor (capacitor component) 13B, and a resistor (resistor component) 13C. The inductor 13A, the capacitor 13B, and the resistor 13C are connected in series with one another to constitute an RCL series circuit. The inductor 13A is an equivalent inductance and represents a parasitic inductance due to an internal electrode, a connection conductor, or the like. The capacitor 13B is an equivalent capacitance. The resistor 13C is a resonant resistance and represents a conductor loss of an internal electrode, a connection conductor, or the like.

The second circuit 15 is connected in parallel with the first capacitor 5. The second circuit 15 is connected in parallel with the first capacitor 5 via the transformer 9. The second circuit 15 is connected in parallel with the first circuit 13. The second circuit 15 includes an inductor (inductor component) 15A, a capacitor (capacitor component) 15B, and a resistor (resistor component) 15C. The inductor 15A, the capacitor 15B, and the resistor 15C are connected in series with one another to constitute an RCL series circuit. The inductor 15A is an equivalent inductance and represents a parasitic inductance due to an internal electrode, a connection conductor, or the like. The capacitor 15B is an equivalent capacitance. The resistor 15C is a resonant resistance and represents a conductor loss of an internal electrode, a connection conductor, or the like.

Figure 2:
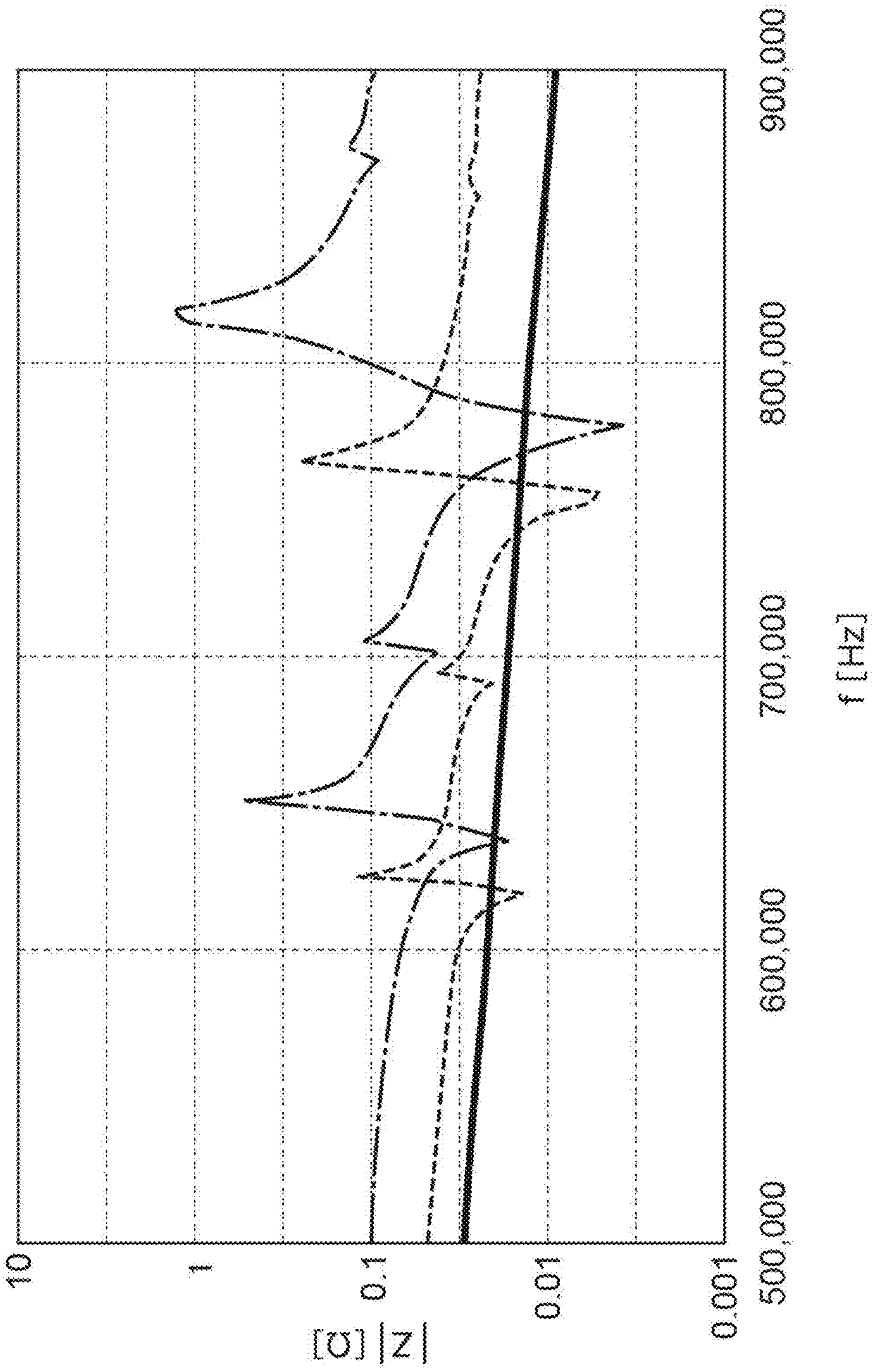
FIG. 2 is a graph illustrating an example of a relationship between frequency and impedance of a multilayer capacitor.

FIG. 2 is a graph illustrating an example of a relationship between frequency and impedance of a multilayer capacitor. In FIG. 2, a horizontal axis represents frequency f [Hz], and a vertical axis represents impedance Z [Ω]. The impedance Z is an absolute value. In FIG. 2, a solid line indicates a measurement result when the voltage value of the direct current voltage is 0 V, a broken line indicates a measurement result when the voltage value of the direct current voltage is 20 V, and a dash-dot line indicates a measurement result when the voltage value of the direct current voltage is 40 V.

As illustrated in FIG. 2, when the voltage value of the direct current voltage is 0 V, no peak appears. When the voltage value of the direct current voltage is 20 V or 40 V, a downward peak and an upward peak appear. The downward peak indicates resonance. The upward peak indicates antiresonance. When the voltage value of the direct current voltage is 20 V or 40 V, a plurality of peaks appears. The peaks increase and appear on a high-frequency side as the voltage value of the direct current voltage becomes large. The absolute value (other than the peaks) of impedance becomes large as the voltage value of the direct current voltage becomes large.

When the direct current voltage is applied to the multilayer capacitor, the peaks are caused as a result of electrostriction of the multilayer capacitor. A reason why no peak appears when the voltage value of the direct current voltage is 0 V is that around the voltage value of 0 V, mechanical deformation hardly occurs even when the voltage is applied. A reason why the absolute value (other than the peaks) of impedance becomes large as the voltage value of the direct current voltage becomes large is that when the voltage value of the direct current voltage becomes large, capacitance of the multilayer capacitor decreases due to DC bias characteristics, and the impedance decreases.

The circuit part 11 in the equivalent circuit 1 represents a phenomenon where a downward peak appears and then an upward peak appears when viewed from a low-frequency side. A phenomenon where a plurality of (e.g., two) peaks appears is represented by connecting the two circuits, namely the first circuit 13 and the second circuit 15, in parallel with each other. The first capacitor 5, whose first capacitance C1 changes in accordance with the voltage value of the direct current voltage, represents a phenomenon where the impedance changes depending on the voltage value of the direct current voltage.

The transformer 9 in the equivalent circuit 1 represents a phenomenon where no peak appears when the voltage value of the direct current voltage is 0 V and a plurality of peaks appears when the direct current voltage is applied. The transformer 9 does not cause a current to flow through the circuit part 11 when the voltage value of the direct current voltage is small and causes a current to flow through the circuit part 11 when the voltage value of the direct current voltage is large. As a result, in the equivalent circuit 1, no peak appears when the voltage value of the direct current voltage is 0 V, and a plurality of peaks appears when the direct current voltage is applied.

The second capacitor 7 having the positive second capacitance C2 in the equivalent circuit 1 represents a phenomenon where positions (frequencies) of the peaks change when the voltage value of the direct current voltage changes.

As described above, in the first capacitor 5 in the equivalent circuit 1 according to the present embodiment, the first capacitance C1 changes in accordance with the voltage value of the direct current voltage applied to the first capacitor 5. As a result, in the equivalent circuit 1, a characteristic can be obtained in which the value of impedance (other than the peaks) changes in accordance with changes in the voltage value of the applied direct current voltage. In addition, in the equivalent circuit 1, the first circuit 13 of the circuit part 11 is achieved by connecting the inductor 13A, the capacitor 13B, and the resistor 13C in series with one another, and the second circuit 15 of the circuit part 11 is achieved by connecting the inductor 15A, the capacitor 15B, and the resistor 15C in series with one another. As a result, in the equivalent circuit 1, a characteristic in which peaks (resonance and antiresonance) appear in impedance can be obtained.

The equivalent circuit 1 includes the second capacitor 7. The second capacitor 7 has the positive second capacitance C2 that changes in accordance with the voltage value of the direct current voltage applied to the first capacitor 5 and that is N (N>0) times the first capacitance C1 of the first capacitor 5. As a result, in the equivalent circuit 1, a characteristic can be obtained in which the frequencies (the resonance frequency and the antiresonance frequency) at which the peaks appear in impedance change when the voltage value of the direct current voltage changes. In the equivalent circuit 1, therefore, a characteristic approximate to a characteristic of a multilayer capacitor of an actual product can be obtained.

The equivalent circuit 1 according to the present embodiment includes the transformer 9. The transformer 9 is provided between the second capacitor 7 and the circuit part 11 and controls the current flowing through the circuit part 11 on the basis of the voltage value of the direct current voltage. With this configuration, when the voltage value of the direct current voltage is small, the current flowing through the circuit part 11 becomes small (the current does not flow through the circuit part 11), and when the voltage value of the direct current voltage is large, the current flowing through the circuit part 11 becomes large. When the current flowing through the circuit part 11 becomes small, no peak appears in impedance. As a result, a characteristic can be obtained in which no peak appears in impedance when the direct current voltage is 0 V.

In the equivalent circuit 1 according to the present embodiment, the second capacitance C2 of the second capacitor 7 is 0.5 times or more and 1.0 times or less the first capacitance C1 of the first capacitor 5, and preferably 0.7 times or more and 0.9 times or less the first capacitance C1. With this configuration, a characteristic can be obtained in which the frequencies (the resonance frequency and the antiresonance frequency) at which the peaks appear in impedance change when the voltage value of the direct current voltage changes.

Second Embodiment

Figure 3:
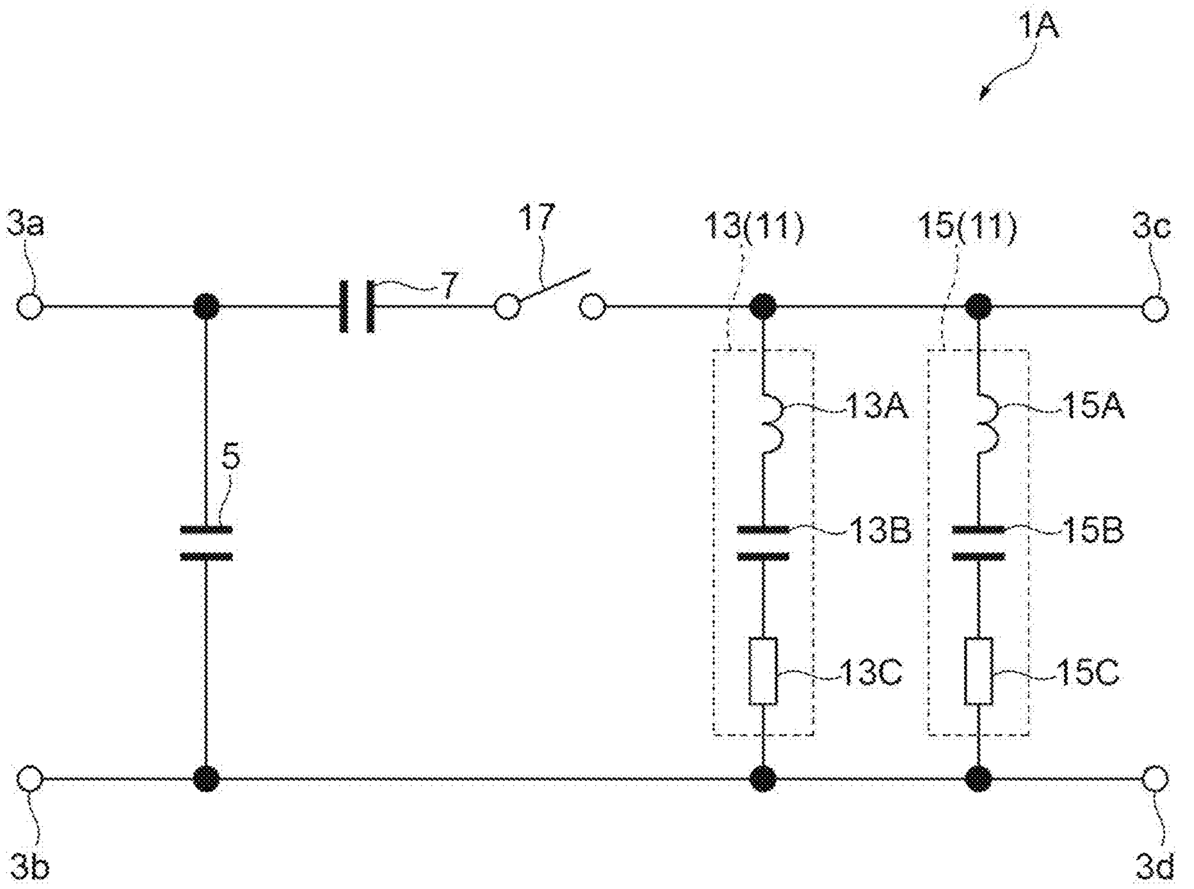
FIG. 3 is a diagram illustrating an equivalent circuit according to a second embodiment.

Next, an equivalent circuit according to a second embodiment will be described. FIG. 3 is a diagram illustrating the equivalent circuit according to the second embodiment. As illustrated in FIG. 3, an equivalent circuit 1A according to the second embodiment includes a first terminal 3*a*, a second terminal 3*b*, a third terminal 3*c*, a fourth terminal 3*d*, a first capacitor 5, a second capacitor 7, a switch (controller) 17, and a circuit part 11. The equivalent circuit 1A is different from the equivalent circuit 1 according to the first embodiment in terms of configuration of the switch 17.

The switch 17 is provided between the second capacitor 7 and the circuit part 11. The switch 17 controls a current flowing through the circuit part 11. The switch 17 controls the current flowing through the circuit part 11 in accordance with a voltage value of a direct current voltage applied to the equivalent circuit 1A. More specifically, the switch 17 increases the current flowing through the circuit part 11 when the voltage value of the direct current voltage becomes large, and reduce the current flowing through the circuit part 11 when the voltage value of the direct current voltage becomes small.

The switch 17 detects a voltage value between one end (first terminal 3*a*) and another end (second terminal 3*b*) of first capacitor 5 and closes and opens on the basis of the detected voltage value. The switch 17 closes when the detected voltage value becomes larger than or equal to a certain value, and opens when the detected voltage value becomes smaller than the certain value.

As described above, in the first capacitor 5 in the equivalent circuit 1A according to the present embodiment, the first capacitance C1 changes in accordance with the voltage value of the direct current voltage applied to the first capacitor 5. As a result, in the equivalent circuit 1A, a characteristic can be obtained in which the value of impedance (other than the peaks) changes in accordance with changes in the voltage value of the applied direct current voltage. In addition, in the equivalent circuit 1A, the first circuit 13 of the circuit part 11 is achieved by connecting the inductor 13A, the capacitor 13B, and the resistor 13C in series with one another, and the second circuit 15 of the circuit part 11 is achieved by connecting the inductor 15A, the capacitor 15B, and the resistor 15C in series with one another. As a result, in the equivalent circuit 1A, a characteristic in which peaks (resonance and antiresonance) appear in impedance can be obtained.

The equivalent circuit 1A includes the second capacitor 7. The second capacitor 7 has the positive second capacitance C2 that changes in accordance with the voltage value of the direct current voltage applied to the first capacitor 5 and that is N (N>0) times the first capacitance C1 of the first capacitor 5. As a result, in the equivalent circuit 1A, a characteristic can be obtained in which the frequencies (the resonance frequency and the antiresonance frequency) at which the peaks appear in impedance change when the voltage value of the direct current voltage changes. In the equivalent circuit 1A, therefore, a characteristic approximate to a characteristic of a multilayer capacitor of an actual product can be obtained.

The equivalent circuit 1A according to the present embodiment includes the switch 17. The switch 17 is provided between the second capacitor 7 and the circuit part 11 and controls the current flowing through the circuit part 11 on the basis of the voltage value of the direct current voltage. With this configuration, when the voltage value of the direct current voltage is small, the current flowing through the circuit part 11 becomes small (the current does not flow through the circuit part 11), and when the voltage value of the direct current voltage is large, the current flowing through the circuit part 11 becomes large. When the current flowing through the circuit part 11 becomes small, no peak appears in impedance. As a result, a characteristic can be obtained in which no peak appears in impedance when the direct current voltage is 0 V.

Third Embodiment

Figure 4:
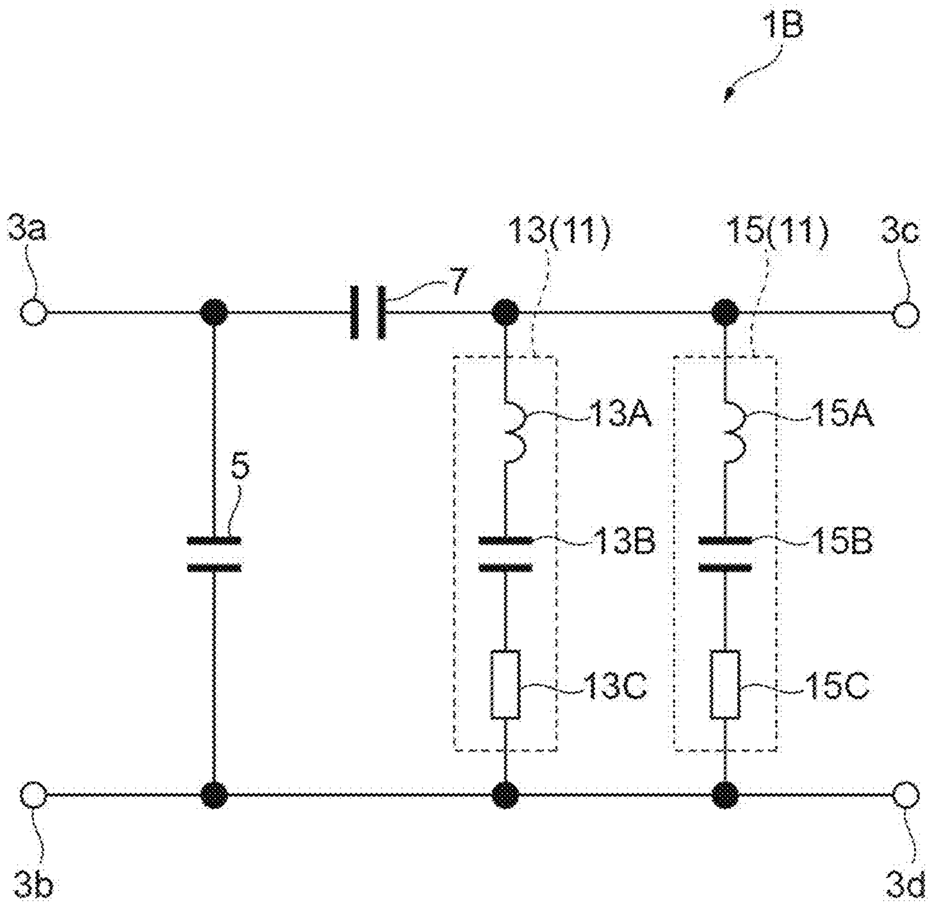
FIG. 4 is a diagram illustrating an equivalent circuit according to a third embodiment.

Next, an equivalent circuit according to a third embodiment will be described. FIG. 4 is a diagram illustrating the equivalent circuit according to the third embodiment. As illustrated in FIG. 4, an equivalent circuit 1B according to the third embodiment includes a first terminal 3*a*, a second terminal 3*b*, a third terminal 3*c*, a fourth terminal 3*d*, a first capacitor 5, a second capacitor 7, and a circuit part 11. The equivalent circuit 1B is different from the equivalent circuit 1 according to the first embodiment and the equivalent circuit 1A according to the second embodiment in that the equivalent circuit 1B does not include a controller.

In the first capacitor 5 in the equivalent circuit 1B according to the present embodiment, the first capacitance C1 changes in accordance with the voltage value of the direct current voltage applied to the first capacitor 5. As a result, in the equivalent circuit 1B, a characteristic can be obtained in which the value of impedance (other than the peaks) changes in accordance with changes in the voltage value of the applied direct current voltage. In addition, in the equivalent circuit 1B, the first circuit 13 of the circuit part 11 is achieved by connecting the inductor 13A, the capacitor 13B, and the resistor 13C in series with one another, and the second circuit 15 of the circuit part 11 is achieved by connecting the inductor 15A, the capacitor 15B, and the resistor 15C in series with one another. As a result, in the equivalent circuit 1B, a characteristic in which peaks (resonance and antiresonance) appear in impedance can be obtained.

The equivalent circuit 1B includes the second capacitor 7. The second capacitor 7 has the positive second capacitance C2 that changes in accordance with the voltage value of the direct current voltage applied to the first capacitor 5 and that is N (N>0) times the first capacitance C1 of the first capacitor 5. As a result, in the equivalent circuit 1B, a characteristic can be obtained in which the frequencies (the resonance frequency and the antiresonance frequency) at which the peaks appear in impedance change when the voltage value of the direct current voltage changes. In the equivalent circuit 1B, therefore, a characteristic approximate to a characteristic of a multilayer capacitor of an actual product can be obtained.

Although embodiments of the present disclosure have been described above, the present disclosure is not necessarily limited to the above-described embodiments, and various modifications can be made without departing from the gist thereof.

In the above embodiments, a mode in which there is one second capacitor 7 has been described as an example. The second capacitor 7, however, may include a plurality of elements, instead.

In the above embodiments, a mode in which the circuit part 11 includes the first circuit 13 and the second circuit 15 has been described as an example. The number of circuits in the circuit part 11, however, may be appropriately set in accordance with the number of peaks that appear in an impedance graph.

In the above embodiments, a mode in which the controller that controls the current flowing through the circuit part 11 on the basis of the voltage value of the direct current voltage is the transformer 9 or the switch 17 has been described as an example. The controller, however, may be another element, instead.

What is claimed is:

1. An equivalent circuit comprising:

a first capacitor having a first capacitance;

a circuit part configured to include an inductor component, a capacitor component, and a resistor connected in series with one another, the circuit part being connected in parallel with the first capacitor; and a second capacitor provided between the first capacitor and the circuit part and having a second capacitance, wherein the first capacitance of the first capacitor changes in accordance with a voltage value of a direct current voltage applied to the first capacitor, and the second capacitance is a positive capacitance that changes in accordance with the voltage value of the direct current voltage applied to the first capacitor and that is N times (N>0) the first capacitance of the first capacitor.

2. The equivalent circuit according to claim 1, further comprising:

a controller provided between the second capacitor and the circuit part and configured to control a current flowing through the circuit part on a basis of the voltage value of the direct current voltage.

3. The equivalent circuit according to claim 2, wherein the controller is a transformer.

4. The equivalent circuit according to claim 1, wherein the second capacitance of the second capacitor is 0.5 times or more and 1.0 times or less the first capacitance of the first capacitor.

* * * * *